(12) United States Patent
Lee et al.

(10) Patent No.: US 9,412,939 B2
(45) Date of Patent: Aug. 9, 2016

(54) FORMING SUBLITHOGRAPHIC HEATERS FOR PHASE CHANGE MEMORIES

(75) Inventors: Jong-Won S. Lee, San Francisco, CA (US); Gianpaolo Spadini, Campbell, CA (US)

(73) Assignee: Carlow Innovations LLC, Alexandria, VA (US)

( * ) Notice: Subject to any disclaimer, the term of this patent is extended or adjusted under 35 U.S.C. 154(b) by 0 days.

(21) Appl. No.: 13/564,783

(22) Filed: Aug. 2, 2012

(65) Prior Publication Data

US 2012/0294076 A1    Nov. 22, 2012

Related U.S. Application Data

(62) Division of application No. 11/546,679, filed on Oct. 12, 2006, now abandoned.

(51) Int. Cl.
*H01L 45/00*    (2006.01)

(52) U.S. Cl.
CPC ............ *H01L 45/1233* (2013.01); *H01L 45/06* (2013.01); *H01L 45/126* (2013.01); *H01L 45/1273* (2013.01); *H01L 45/16* (2013.01)

(58) Field of Classification Search
CPC ........................................................ H01L 45/06
USPC .......................................... 438/104; 257/2–5
See application file for complete search history.

(56) References Cited

U.S. PATENT DOCUMENTS

| | | | |
|---|---|---|---|
| RE37,259 E * | 7/2001 | Ovshinsky | .................... 365/163 |
| 6,423,621 B2 * | 7/2002 | Doan et al. | .................... 438/597 |
| 6,545,287 B2 * | 4/2003 | Chiang | ............................ 257/3 |
| 6,744,088 B1 | 6/2004 | Dennison | |
| 6,746,892 B2 * | 6/2004 | Lee et al. | ......................... 438/95 |
| 7,560,337 B2 * | 7/2009 | Ho et al. | ....................... 438/257 |
| 2003/0002331 A1 * | 1/2003 | Park et al. | ..................... 365/163 |
| 2006/0097238 A1 * | 5/2006 | Breuil et al. | ....................... 257/4 |
| 2006/0284237 A1 * | 12/2006 | Park et al. | ..................... 257/314 |
| 2007/0040159 A1 | 2/2007 | Wang | |
| 2007/0173019 A1 * | 7/2007 | Ho et al. | ....................... 438/257 |
| 2007/0279974 A1 | 12/2007 | Dennison et al. | |

* cited by examiner

*Primary Examiner* — Mark Tornow
(74) *Attorney, Agent, or Firm* — Kevin L. Bray

(57) ABSTRACT

A phase change memory with a heater with sublithographic dimensions may be achieved, in some embodiments, with lower thermal budget. The phase change memory may use a controlled etching process to reduce the lateral dimension of the heater.

8 Claims, 3 Drawing Sheets

FORMING SUBLITHOGRAPHIC HEATERS FOR PHASE CHANGE MEMORIES

CROSS-REFERENCE TO RELATED APPLICATIONS

This application is a divisional of U.S. patent application Ser. No. 11/546,679, filed on Oct. 12, 2006 now abandoned.

BACKGROUND

This invention relates generally to phase change memories.

Phase change memory devices use phase change materials, i.e., materials that may be electrically switched between a generally amorphous and a generally crystalline state, for electronic memory application. One type of memory element utilizes a phase change material that may be, in one application, electrically switched between a structural state of generally amorphous and generally crystalline local order or between different detectable states of local order across the entire spectrum between completely amorphous and completely crystalline states. The state of the phase change materials is also non-volatile in that, when set in either a crystalline, semi-crystalline, amorphous, or semi-amorphous state representing a resistance value, that value is retained until changed by another programming event, as that value represents a phase or physical state of the material (e.g., crystalline or amorphous). The state is unaffected by removing electrical power.

DETAILED DESCRIPTION

In accordance with some embodiments of the present invention, a phase change memory may be formed with a so-called sublithographic heater. A sublithographic heater is a heater which has a lateral dimension which is smaller than the smallest dimension possible with lithographic techniques or currently about eighty nanometers.

Rather than using a lithographic or masking technique, the ultimate cross-sectional area of the heater, in some embodiments of the present invention, may be determined by a controlled etching process.

In some cases, the lateral dimension of the heater is smaller which may result in many improved characteristics in some cases. A reduced heater dimension may aid in reducing the unit cell area of a phase change memory cell. In addition, the sensitivity of a phase change memory cell's cycling endurance may be improved. The unit cell size is typically limited by the size of the device needed to supply the programming current to the storage cell. The magnitude of that programming current is generally governed by the heater dimension. Thus, the phase change memory unit cell area depends on how small the heater can be defined in a repeatable fashion. The relationship between the cycling endurance and programming current magnitude is such that the smaller programming current preserves the memory cell's initial data fidelity to high cycling numbers, thus extending the product lifetime or enabling the product to serve more read/write intensive applications.

In addition, it may be desirable to enable the fabrication of sublithographic heaters with less thermal budget. The thermal budget may be an important consideration, in some embodiments, since chalcogenide alloys used in phase change memories have limited thermal endurance during wafer processing.

Figure 1:
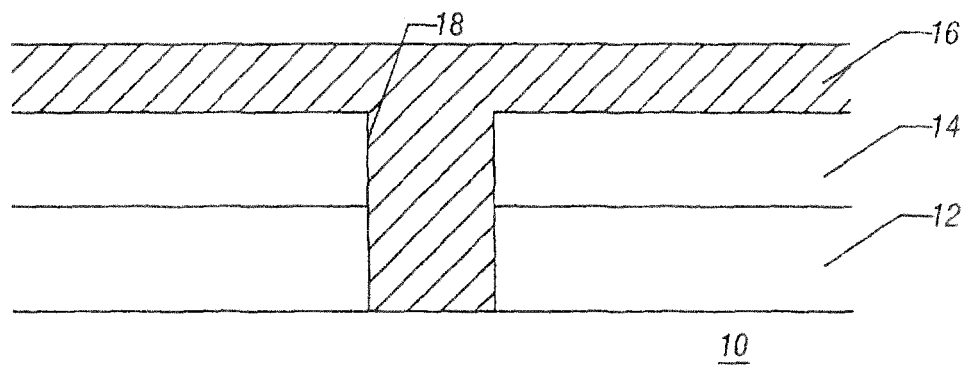
FIG. 1 is an enlarged, cross-sectional view of one embodiment of the present invention at an early stage of manufacture.

Referring to FIG. 1, initially, a phase change memory cell may be formed over a substrate 10. In some embodiments of the present invention, the substrate 10 may include a diffusion which acts as a row line for the phase change memory. Over the row line in the substrate 10 may be formed a dielectric layer. In some embodiments, the dielectric layer may be formed of two distinct layers 12 and 14. A pore 18 is formed through the two layers, down to the substrate 10, in some embodiments. The pore 18 may be filled with the heater material 16. A number of different heat materials may be utilized, including those that include titanium, titanium nitride, or other alloys or resistive conductors.

Figure 2:
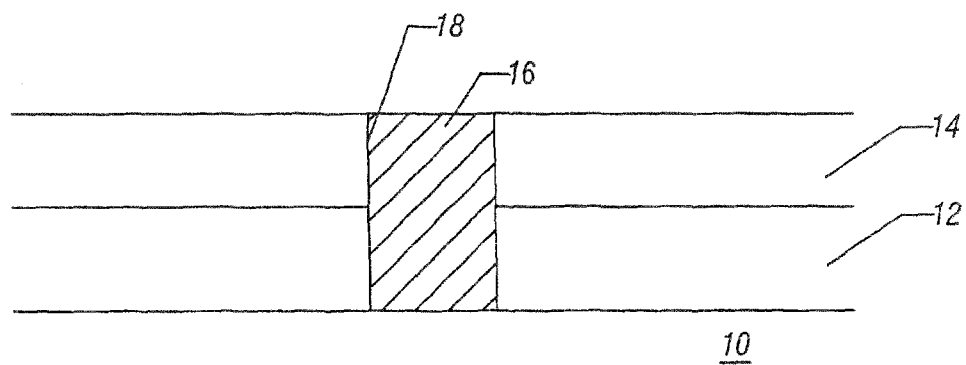
FIG. 2 is an enlarged, cross-sectional view at a subsequent stage in accordance with one embodiment of the present invention.

Then, referring to FIG. 2, the structure shown in FIG. 1 may be planarized to form the bulk heater 16 within the pore 18. As an alternative, a subtractive etch process with masking may be used to form the bulk heater 16. Other techniques may be utilized as well.

Figure 3:
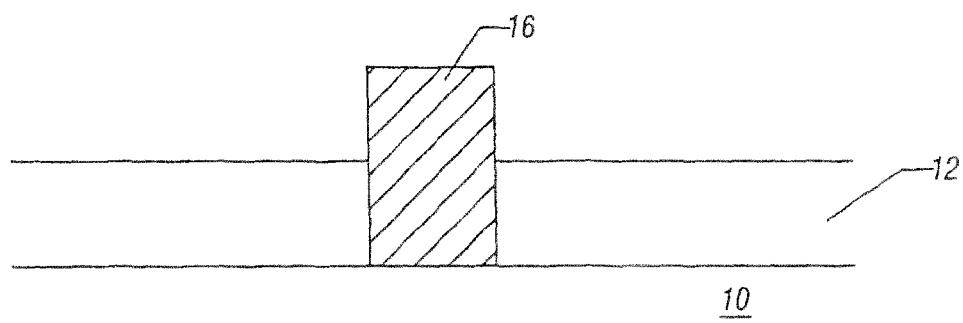
FIG. 3 is an enlarged, cross-sectional view at a subsequent stage in accordance with one embodiment of the present invention.

Moving to FIG. 3, the upper layer 14 may be removed, for example, with a selective etch which selectively removes the layer 14, rather than the layer 12 or the bulk heater 16.

Figure 4:
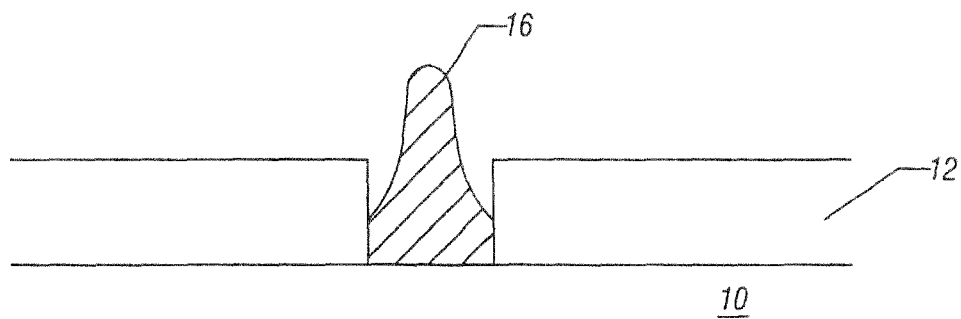
FIG. 4 is an enlarged, cross-sectional view at a subsequent stage in accordance with one embodiment of the present invention.

Thereafter, as shown in FIG. 4, subtractive etching processing may be utilized to form a sublithographic lateral dimension of the heater 16. Preferably an etchant is used which is selective of the bulk heater 16 over the exposed dielectric layer 12. The chemical etching may be accomplished with plasma or wet etching, for example, using chlorine based etchants. The etching may be to a controlled depth, at a controlled etch rate for a controlled etch time. As a result, the exposed vertical dimension of the heater 16 is etched laterally, reducing the heater width.

Figure 5:
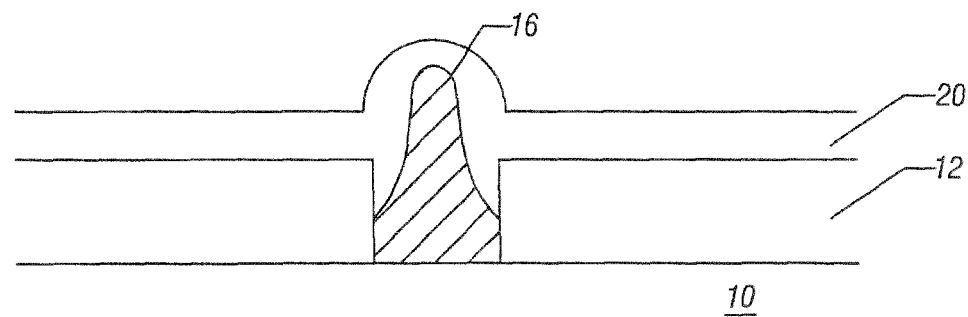
FIG. 5 is an enlarged, cross-sectional view at a subsequent stage in accordance with one embodiment of the present invention.
Figure 6:
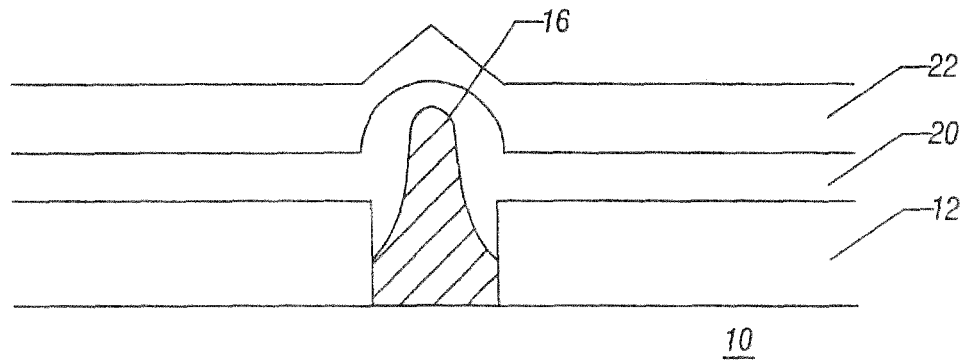
FIG. 6 is an enlarged, cross-sectional view at a subsequent stage of manufacture in accordance with one embodiment of the present invention.

Next, as shown in FIG. 5, a dielectric layer 20 may be deposited as a chemical mechanical planarization stop 20. Thereafter, as shown in FIG. 6, a sacrificial material 22 may be deposited to improve chemical mechanical planarization controllability and to reduce surface topography. The sacrificial layer may be spun on or deposited by plasma enhanced chemical vapor deposition.

Figure 7:
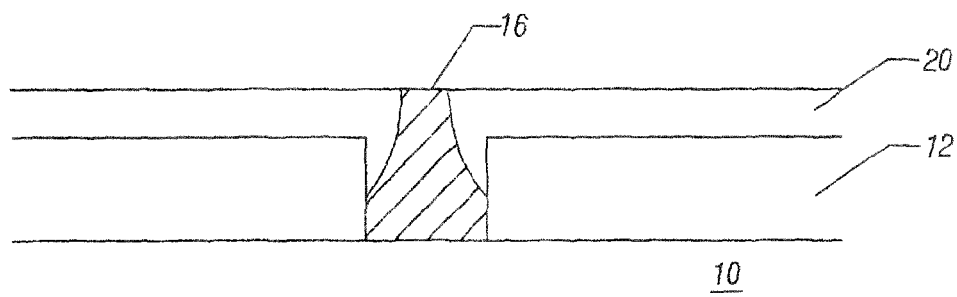
FIG. 7 is an enlarged, cross-sectional view at a subsequent stage in accordance with one embodiment of the present invention.

As shown in FIG. 7, the chemical mechanical planarization step may planarize the structure down to the layer 20, removing the upper portion of the bulk heater and forming the heater 16 of a reduced lateral dimension. In some embodiments, the lateral dimension of the heater may be a sublithographic dimension which is less than any dimension possible with existing lithographic, techniques.

As a result of the way the heater 16 is formed, it may have an inverted T-shape, with curved sides that taper towards one another and a thicker base.

In some embodiments, there is no need to form a conformal spacer to create the sublithographic heater. Conformal spacer deposition may be accomplished by high temperature chemical vapor deposition or atomic layer deposition for control of the geometry of the resulting spacer. By eliminating the spacer deposition process, a lower temperature process may be achieved in some cases.

Thereafter, ensuing layers may be utilized to either complete a phase change memory cell or, if desired, to form a select device thereover. The select device may, for example, be a diode, a transistor, or an ovonic threshold switch.

Figure 8:
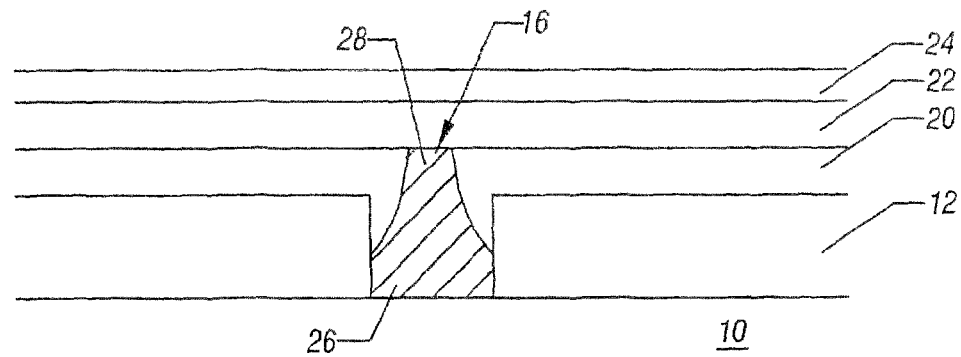
FIG. 8 is an enlarged, cross-sectional view at a subsequent stage in accordance with one embodiment of the present invention.

In FIG. 8, a simple structure is illustrated in which a single ovonic memory cell is created by applying a layer 22 of chalcogenide, followed by a metallic layer 24 which, in some embodiments, may form a column line. Thereafter, if desired, en etching process may be utilized to define the width of the chalcogenide 22 and the Layer 24. Thus, in some embodiments, the column may run into the page while the row runs across the page within the substrate 10.

The inverted or T-shaped heater 16 has a horizontally extending portion 26 and a vertically extending portion 28 in one embodiment. The portion 28 may be closest to the chalcogenide 22 in one embodiment.

Programming of the chalcogenide material 22 to alter the state or phase of the material may be accomplished by applying voltage potentials to the lower electrode and upper electrode 24, thereby generating a voltage potential across the select device and memory element. When the voltage potential is greater than the threshold voltages of select device and memory element, then an electrical current may flow through the chalcogenide material 30 in response to the applied voltage potentials, and may result in heating of the chalcogenide material 22.

This heating may alter the memory state or phase of the chalcogenide material 22. Altering the phase or state of the chalcogenide material 22 may alter the electrical characteristic of memory material, e.g., the resistance of the material may be altered by altering the phase of the memory material. Memory material may also be referred to as a programmable resistive material.

In the "reset" state, memory material may be in an amorphous or semi-amorphous state and in the "set" state, memory material may be in an a crystalline or semi-crystalline state. The resistance of memos material in the amorphous or semi-amorphous state may be greater than the resistance of memory material in the crystalline or semi-crystalline state. It is to be appreciated that the association of reset and set with amorphous and crystalline states, respectively, is a convention and that at least an opposite convention may be adopted.

Using electrical current, memory material may be heated to a relatively higher temperature to amorphosize memory material and "reset" memory material (e.g., program memory material to a logic "0" value). Heating the volume of memory material to a relatively lower crystallization temperature may crystallize memory material and "set" memory material (e.g., program memory material to a logic "1" value). Various resistances of memory material may be achieved to store information by varying the amount of current flow and duration through the volume of memory material.

A select device may operate as a switch that is either "off" or "on" depending on the amount of voltage potential applied across the memory cell, and more particularly whether the current through the select device exceeds its threshold current or voltage, which then triggers the device into the on state. The off state may be a substantially electrically nonconductive state and the on state may be a substantially conductive state, with less resistance than the off state.

In the on state, the voltage across the select device, in one embodiment, is equal to its holding voltage $V_H$ plus IxRon, where Ron is the dynamic resistance from the extrapolated X-axis intercept, $V_H$. For example, a select device may have threshold voltages and, if a voltage potential less than the threshold voltage of a select device is applied across the select device, then the select device may remain "off" or in a relatively high resistive state so that little or no electrical current passes through the memory cell and most of the voltage drop from selected row to selected column is across the select device. Alternatively, if a voltage potential greater than the threshold voltage of a select device is applied across the select device, then the select device may "turn on," i.e., operate in a relatively low resistive state so that electrical current passes through the memory cell. In other words, one or more series connected select devices may be in a substantially electrically nonconductive state if less than a predetermined voltage potential, e.g., the threshold voltage, is applied across select devices. Select devices may be in a substantially conductive state if greater than the predetermined voltage potential is applied across select devices. Select devices may also be referred to as an access device, an isolation device, or switch.

In one embodiment, each select device may comprise a switch material 16 such as, for example, a chalcogenide alloy, and may be referred to as an ovonic threshold switch, or simply an ovonic switch. The switch material 22 of select devices may be a material in a substantially amorphous state positioned between two electrodes that may be repeatedly and reversibly switched between a higher resistance "off" state (e.g., greater than about ten megaOhms) and a relatively lower resistance "on" state (e.g., about one thousand Ohms in series with $V_H$) by application of a predetermined electrical current or voltage potential. In this embodiment, each select device may be a two terminal device that may have a current-voltage (I-V) characteristic similar to a phase change memory element that is in the amorphous state. However, unlike a phase change memory element, the switching material of select devices may not change phase. That is, the switching material of select devices may not be programmable material, and, as a result, select devices may not be a memory device capable of storing information. For example, the switching material of select devices may remain permanently amorphous and the I-V characteristic may remain the same throughout the operating life.

In the low voltage or low electric field mode, i.e., where the voltage applied across select device is less than a threshold voltage (labeled $V_{TH}$), a select device may be "off" or non-conducting, and exhibit a relatively high resistance, e.g., greater than about 10 megaOhms. The select device may remain in the off state until a sufficient voltage, e.g., $V_{TH}$, is applied, or a sufficient current is applied, e.g., $I_{TH}$, that may switch the select device to a conductive, relatively low resistance on state. After a voltage potential of greater than about $V_{TH}$ is applied across the select device, the voltage potential across the select device may drop ("snapback") to a holding voltage potential, $V_H$. Snapback may refer to the voltage difference between $V_{TH}$ and $V_H$ of a select device.

In the on state, the voltage potential across select device may remain close to the holding voltage of $V_H$ as current passing through select device is increased. The select device may remain on until the current through the select device drops below a holding current. Below this value, the select device may turn off and return to a relatively high resistance, nonconductive off state until the $V_{TH}$ and $I_{TH}$ are exceeded again.

In some embodiments, only one select device may be used. In other embodiments, more than two select devices may be used. A single select device may have a $V_H$ about equal to its threshold voltage, $V_{TH}$, (a voltage difference less than the threshold voltage of the memory element) to avoid triggering a reset bit when the select device triggers from a threshold voltage to a lower holding voltage called the snapback voltage. An another example, the threshold current of the memory element may be about equal to the threshold current of the access device even though its snapback voltage is greater than the memory element's reset bit threshold voltage.

One or more MOS or bipolar transistors or one or more diodes (either MOS or bipolar) may be used as the select device. If a diode is used, the bit may be selected by lowering the row line from a higher deselect level. As a further non-limiting example, if an n-channel MOS transistor is used as a select device with its source, for example, at ground, the row line may be raised to select the memory element connected between the drain of the MOS transistor and the column line. When a single MOO or single bipolar transistor is used as the select device, a control voltage level may be used on a "row line" to turn the select device on and off to access the memory element.

Figure 9:
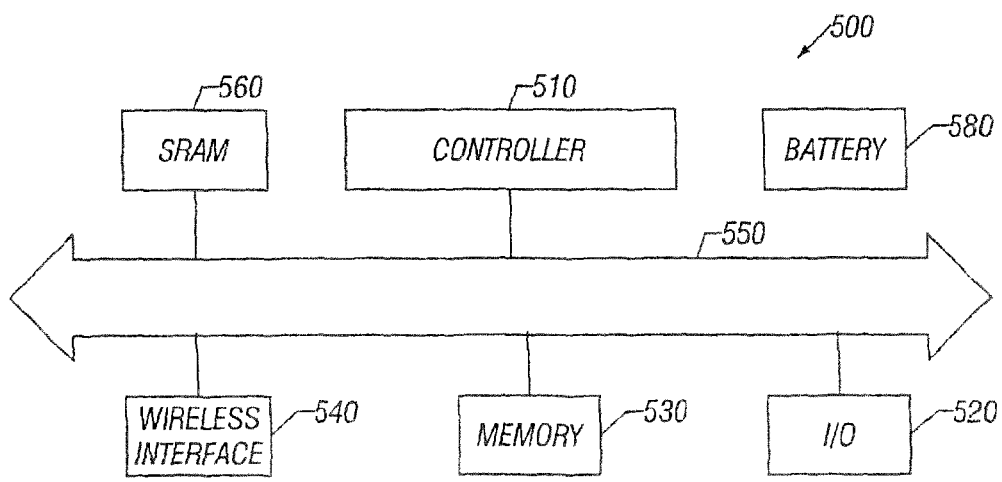
FIG. 9 is a system depiction of one embodiment of the present invention.

Turning to FIG. 9, a portion of a system 500 in accordance with an embodiment of the present invention is described. System 500 may be used in wireless devices such as, for example, a personal digital assistant (PDA), laptop or portable computer with wireless capability, a web tablet, a wireless telephone, a pager, an instant messaging device, a digital music player, a digital camera, or other devices that may be adapted to transmit and/or receive information wirelessly. System 500 may be used in any of the following systems: a wireless local area network (WLAN) system, a wireless personal area network (WPAN) system, a cellular network, although the scope of the present invention is not limited in this respect.

System 500 may include a controller 510, an input/output (I/O) device 520 (e.g. a keypad, display), static random access memory (SRAM) 560, a memory 530, and a wireless interface 540 coupled to each other via a bus 550. A battery 580 may be used in some embodiments. It should be noted that the scope of the present invention is not limited to embodiments having any or all of these components.

Controller 510 may comprise, for example, one or more microprocessors, digital signal processors, microcontrollers, or the like. Memory 530 may be used to store messages transmitted to or by system 500. Memory 530 may also optionally be used to store instructions that are executed by controller 510 during the operation of system 500, and may be used to store user data. Memory 530 may be provided by one or more different types of memory. For example, memory 530 may comprise any type of random access memory, a volatile memory, a non-volatile memory such as a flash memory and/or a memory such as memory discussed herein.

I/O device 520 may be used by a user to generate a message. System 500 may use wireless interface 540 to transmit and receive messages to and from a wireless communication network with a radio frequency (RF) signal. Examples of wireless interface 540 may include an antenna or a wireless transceiver, although the scope of the present invention is not limited in this respect.

References throughout this specification to "one embodiment" or "an embodiment" mean that a particular feature, structure, or characteristic described in connection with the embodiment is included in at least one implementation, encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A phase change memory comprising:
   a chalcogenide material;
   a heater for said chalcogenide material, said heater having an inverted T-shape with a horizontally extending portion and a vertically extending portion, said vertically extending portion adjacent said chalcogenide material and having a curved concave external surface, tapering inwardly to a vertical tip;
   only the vertical tip of said vertically extending portion contacting said chalcogenide material in cross section;
   a first dielectric layer having a top surface and a passage through said first dielectric layer, said heater being positioned in said passage, said horizontally extending portion having vertical end walls defining said passage through said first dielectric layer; and
   a second dielectric layer over and entirely covering said top surface of said first dielectric layer, said second dielectric layer abutting said curved concave external surface and said chalcogenide material.

2. The memory of claim 1 wherein said vertically extending portion has a sublithographic lateral extent.

3. The memory of claim 1 wherein said heater horizontally extending portion is wider in a lateral direction than said vertically extending portion.

4. The memory of claim 1 wherein said heater vertically extending portion is in contact with said chalcogenide material.

5. A system comprising:
   a processor;
   a phase change memory coupled to said processor, said phase change memory including a chalcogenide material and a heater having an inverted T-shape, having a wider and narrower portion, said narrower portion of the heater being closer to said chalcogenide material and said narrower portion having a curved concave external surface, tapering inwardly to a vertical tip;
   only the vertical tip of said narrower portion contacting said chalcogenide material in cross section;
   a first dielectric layer having a top surface and a passage through said first dielectric layer, said heater being positioned in said passage, said horizontally extending portion having vertical end walls defining said passage through said first dielectric layer; and
   a second dielectric layer over and entirely covering said top surface of said first dielectric layer, said second dielectric layer abutting said curved concave external surface and said chalcogenide material.

6. The system of claim 5 wherein said narrower portion has a sublithographic lateral extent.

7. The system of claim 5 wherein said wider portion is wider in a lateral direction than said narrower portion.

8. The system of claim 5 wherein said narrower portion is in contact with said chalcogenide material.

* * * * *